United States Patent
Du et al.

(10) Patent No.: US 11,762,006 B2
(45) Date of Patent: Sep. 19, 2023

(54) METHOD FOR ACCURATE FAULT LOCATION IN A MULTI-TYPE CABLE CONNECTION SYSTEM, A DEVICE AND A STORAGE MEDIUM THEREOF

(71) Applicant: TRANSCOM INSTRUMENTS CO., LTD., Shanghai (CN)

(72) Inventors: Jian Du, Shanghai (CN); Lei Yu, Shanghai (CN)

(73) Assignee: TRANSCOM INSTRUMENTS CO., LTD., Shanghai (CN)

( * ) Notice: Subject to any disclaimer, the term of this patent is extended or adjusted under 35 U.S.C. 154(b) by 739 days.

(21) Appl. No.: 16/496,806

(22) PCT Filed: Dec. 10, 2018

(86) PCT No.: PCT/CN2018/120090
§ 371 (c)(1),
(2) Date: Sep. 23, 2019

(87) PCT Pub. No.: WO2019/114657
PCT Pub. Date: Jun. 20, 2019

(65) Prior Publication Data
US 2021/0102988 A1    Apr. 8, 2021

(30) Foreign Application Priority Data

Dec. 17, 2017   (CN) .......................... 201711318131.4

(51) Int. Cl.
*G01R 31/08* (2020.01)

(52) U.S. Cl.
CPC ......... *G01R 31/088* (2013.01); *G01R 31/083* (2013.01)

(58) Field of Classification Search
CPC .......................... G01R 31/088; G01R 31/083
See application file for complete search history.

(56) References Cited

FOREIGN PATENT DOCUMENTS

| CN | 103969553 A | * | 8/2014 |
| CN | 105510766 A | * | 4/2016 |
| CN | 105510767 A | * | 4/2016 |
| WO | WO 2019/114657 A1 | | 6/2019 |

* cited by examiner

*Primary Examiner* — Robert H Kim
*Assistant Examiner* — Christopher J Gassen
(74) *Attorney, Agent, or Firm* — MaxGoLaw PLLC

(57) ABSTRACT

A method for accurate fault location in a multi-type cable connection system is provided that includes, first normalizing the measurement parameters, then grouping the data, calculating compensation correction, finding the maximum value of the data, and comparing whether the cable has faults or not. By means of a blended data automatic analysis algorithm of the method, in the presence of multiple cables, data obtained through one-time measurement can be accurately identified to determine specific data of each scanning point that belongs to each cable, and after data allocation is completed, each group of data is separately corrected by using cable parameters corresponding to the group of data, thereby obtaining an accurate fault position and a DTF return loss result.

12 Claims, 3 Drawing Sheets

METHOD FOR ACCURATE FAULT LOCATION IN A MULTI-TYPE CABLE CONNECTION SYSTEM, A DEVICE AND A STORAGE MEDIUM THEREOF

CROSS-REFERENCE TO RELATED APPLICATION

This application claims priority of China invention Patent Application No. 201711318131.4 filed Dec. 12, 2017, the contents of which are hereby incorporated by reference.

FIELD OF TECHNOLOGY

The present invention relates to the technical field of fault location in a cable, especially to the technical field of accurate fault location in a multi-type cable connection system, in particular to a method for accurate fault location in a multi-type cable connection system, a device, and a storage medium thereof.

DESCRIPTION OF RELATED ARTS

The technology of cable fault location is widely used. For example, a communication cable may be composed of one cable, or may be composed of multiple cables through connectors etc. The connector may become loose or may be damaged in the process of using it, and it may result in a decline in the performance of the entire communication cable, in which case cable fault location technology is required for fault location.

The traditional method for finding a cable fault location mainly uses cable and antenna analyzers. The measurement format of the cable and antenna analyzer is DTF_SWR, and set values of velocity factor of a cable, cable loss, value of measured distance, and numbers of selected measuring points. According to the measurement result of the cable and antenna analyzer, the location of a fault point can be obtained. If the cable runs normally, the actual length of the cable can be measured. For a single type of cable, the cable and antenna analyzer can accurately locate the fault point. However, in the actual cable system, many types of cables may be used, and each cable has different parameters. If the traditional positioning method is used for finding a fault location, the cable and antenna analyzer cannot distribute the scan data according to different cables. It can only be processed according to one type of cable, so the location of a fault point will be inaccurate. For example, when a maintenance worker locates a leaky cable in the high-speed rail tunnel, if the leaky cable system consists of multiple types of cables, there is a large deviation in the location of the fault point which is located by using the traditional method for accurate fault location with cable and antenna analyzers and the actual location of the fault point.

Therefore, there exists a need for a method for accurate fault location in a multi-type cable connection system.

SUMMARY OF THE INVENTION

In view of the shortcomings of the above mentioned existing technology, the present invention aims to provide an efficient and accurate method for locating a fault in a multi-type cable connection system, of which the operation process is simple and fast, the work performance is stable and reliable, and the scope of application is wide.

Another purpose of the present invention is to provide a device for realizing accurate fault location in a multi-type cable connection system.

Another further purpose of the present invention is to provide a computer readable storage medium to implement the method for accurate fault location in a multi-type cable connection system.

In order to achieve the above purpose, the method, device, and computer readable storage medium for accurate fault location in a multi-type cable connection system of the present invention implements the following technical solutions:

The method for accurate fault location in multi-type cable connection system, wherein, the method has the following steps:

(1) setting an initial data and measurement format of a cable and antenna analyzer, and exporting M measurement data Data[M] of the said cable and antenna analyzer;

(2) dividing the M measurement data into three sets of data, each set of data corresponding to one segment of the cable, and respectively calculating the number of measuring points M1, M2, M3 of three sets of data;

(3) processing the three sets of measurement data separately using linear compensation;

(4) calculating DTF_SWR data RData[M] based on the compensated data;

(5) calculating a location of a fault point.

Preferably, the initial data in step (1) including values of a velocity factor of cable, a cable loss, a value of a measured distance L, and numbers of selected measuring points M.

Preferably, the value of the velocity factor of the cable is 1.

Preferably, the cable loss is 0.

Preferably, the value of the measured distance L accords with the following formula:

$$L \geq \left(\frac{L1}{V1} + \frac{L2}{V2} + \frac{L_x}{V3}\right);$$

wherein, L1 is a length of the first cable, L2 is a length of the second cable, $L_x$ is a length of the third cable, V1 is a value of a velocity factor of the first segment of the cable, V2 is a value of a velocity factor of the second segment of the cable, and V3 is a value of a velocity factor of the third segment of the cable.

Preferably, the process of measuring point M1 of one set of data in step (2), is:

calculated according to the following formula:

$$M1 = \frac{M \times L1}{(L1 + L2 + L_x)};$$

wherein, M is the number of selected measurement point, L1 is the length of the first segment of the cable, L2 is the length of the second segment of the cable, $L_x$ is the length of the third segment of the cable.

Preferably, measuring point M2 of one set of data in step (2), is:

calculated according to the following formula:

$$M2 = \frac{M \times L2}{(L1 + L2 + L_x)};$$

wherein, M is the number of selected measurement point, L1 is the length of the first segment of the cable, L2 is the length of the second segment of the cable, $L_x$ is the length of the third segment of the cable.

Preferably, measuring point M3 of one set of data in step (2), is calculated according to the following formula:

M3=M−M1−M2;

wherein, M is the number of selected measurement points.

Preferably, step (3) specifically comprises the following steps:
(3.1) calculating the first set of measurement data of the first segment of the cable using linear compensation;
(3.2) calculating the second set of measurement data of the second segment of the cable using linear compensation;
(3.3) calculating the third set of measurement data of the third segment of the cable using linear compensation.

Preferably, calculating the first set of measurement data of the first segment of the cable using linear compensation in step (3.1), is:
done according to the following formula:

NData[N]=Data[N]+N×Loss1×2;

wherein, Loss1 is a cable loss of the first segment of the cable, and the value of N is 0, 1, . . . , M1−1.

Preferably, calculating the second set of measurement data of the second segment of the cable using linear compensation in step (3.2), is:
done according to the following formula:

CLoss1=L1×Loss1×2;

NData[N]=Data[N]+(N−M1)×Loss2×2+CLoss1;

wherein L1 is the length of the first segment of the cable, Loss1 is the cable loss of the first segment of the cable, Loss2 is the cable loss of the second segment of the cable, CLoss1 is the fixed loss of the first segment of the cable, and the value of N is M1, . . . , (M1+M2−1).

Preferably, calculating the third set of measurement data of the third segment of the cable with using linear compensation in step (3.3), is:
done according to the following formula:

CLoss2=L2×Loss2×2;

NData[N]=Data[N]+(N−M1−M2)×Loss3×2+CLoss1+CLoss2;

wherein, L2 is the length of the second segment of the cable, Loss2 is the cable loss of the second segment of the cable, Loss3 is the cable loss of the third segment of the cable, CLoss1 is the fixed loss of the first segment of the cable, CLoss2 is the fixed loss of the second segment of the cable, and the value of N is (M1+M2), . . . , (M−1).

Preferably, calculating DTF_SWR data RData[M] in step (4), is:
done according to the following formula:

$$Rho = 10^{\frac{-NData[N]}{2}};$$

$$RData[N] = \begin{cases} 1000(Rho = 1) \\ |1 + Rho|(Rho \neq 1) \end{cases};$$

wherein, Rho is a reflection coefficient and NData[N] is a compensation value of the measurement data.

Preferably, step (5) further includes the following steps:
(5.1) searching RData[N], and recording a maximum value RMax in RData[N] and its corresponding position I in RData[N];
(5.2) judging whether the maximum value RMax is greater than a preset threshold SWR_Limit of DTF_SWR or not; and if so, the cable system is in trouble, then calculating and recording a fault point position DTF_Len; otherwise, the cable system runs normally.

Preferably, calculating the fault point position DTF_Len in step (5.2), is:
done according to the following formula:

$$DFT_{Len} = I \times \frac{(L1 + L2 + L_x)}{M - 1};$$

wherein, L1 is the length of the first segment of the cable, L2 is the length of the second segment of the cable, and $L_x$ is the length of the third segment of the cable.

A device for realizing accurate fault location in a multi-type cable connection system, wherein, the device comprises storage for storing a program and a processor for executing the program, which implements the above method for accurate fault location in a multi-type cable connection system.

A computer readable storage medium, comprising a program executed by processor to implement the above method for accurate fault location in a multi-type cable connection system.

The beneficial effect of the present invention compared with the existing technology is: through the hybrid data automatic analysis algorithm of the present invention, the data obtained from one measurement can be accurately identified as the data of each scanning point and to which segment of the cables it belongs. Each set of data can be corrected with the cable parameters corresponding to the set of data respectively after the data distribution, so that the accurate locations of a fault point and the results of DTF Return Loss are obtained. By using the new method of fault location, the accuracy of cable position measurement is greatly improved.

DETAILED DESCRIPTION OF THE PREFERRED EMBODIMENT

Figure 1:
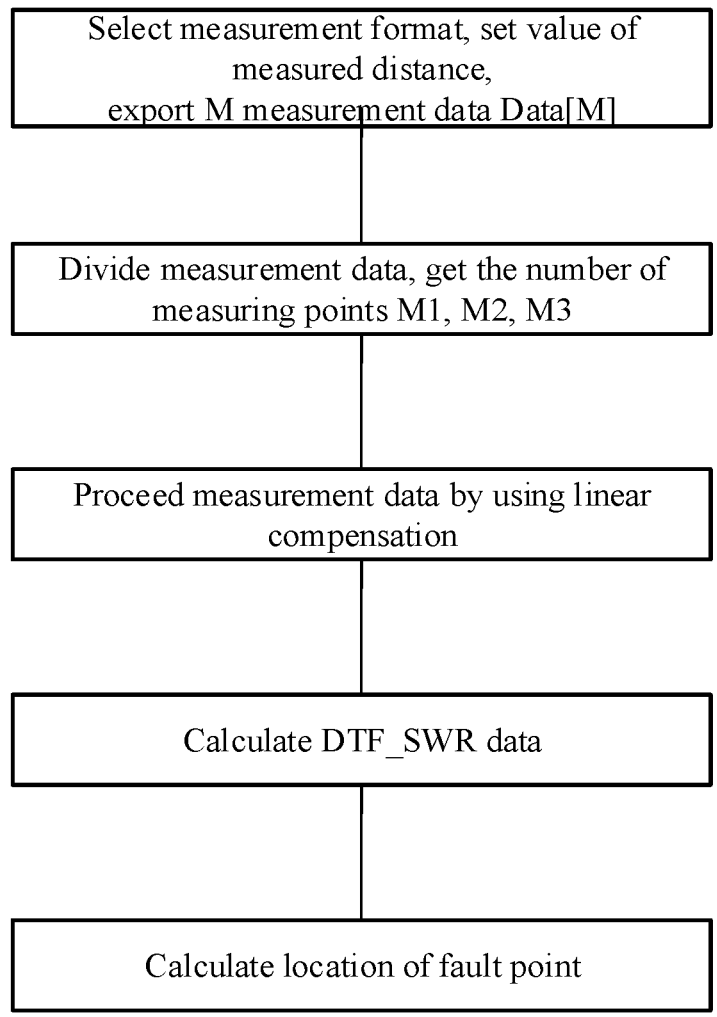
FIG. 1 is an overall flow chart of the method for accurate fault locating in a multi-type cable connection system.

The present invention is further exemplified hereinafter by reference to the accompanying drawings and the following embodiments to make the object, technical solutions and advantages of the present invention more clear. It is understood that the specific embodiments in this application are only used to explain the present invention instead of limit the present invention.

It should be noted that when a component is referred to as being "fixed" or "set" on another component, it can be directly on another component or possibly exist a single-component at the same time. When a component is referred to as being "connected" to another component, it can be directly connected to another component or may exist a single component at the same time.

It should also be noted that the expressions of left, right, upper and lower directions in the embodiments of the present invention are merely relative concepts or refer to the normal usage state of the product an are not intended to be limiting.

The method for accurate fault location in a multi-type cable connection system in this invention has the following steps:

(1) setting an initial data and measurement format of a cable and antenna analyzer, and exporting M measurement data Data[M] of the said cable and antenna analyzer;

(2) dividing the M measurement data into three sets of data, each set of data corresponding to one segment of the cable, and respectively calculating the number of measuring points M1, M2, M3 of three sets of data;

(3) processing the three sets of measurement data separately using linear compensation;

(3.1) calculating the first set of measurement data of the first segment of the cable using linear compensation;

(3.2) calculating the second set of measurement data of the second segment of the cable using linear compensation;

(3.3) calculating the third set of measurement data of the third segment of the cable using linear compensation;

(4) calculating DTF_SWR data RData[M] based on the compensated data;

(5) calculating a location of a fault point;

(5.1) searching RData[N], and recording a maximum value RMax in RData[N] and its corresponding position I in RData[N];

(5.2) judging whether the maximum value RMax is greater than a preset threshold SWR_Limit of DTF_SWR or not; and if so, the cable system is in trouble, then calculating and recording the fault point position DTF_Len; otherwise, the cable system runs normally.

As a preferred embodiment of the present invention, the initial data in step (1) includes values of velocity factor of the cable, cable loss, value of measured distance L and numbers of selected measuring points M.

As a preferred embodiment of the present invention, the value of velocity factor of the cable is 1.

As a preferred embodiment of the present invention, the cable loss is 0.

As a preferred embodiment of the present invention, the value of measured distance L accords with the following formula:

$$L \geq \left(\frac{L1}{V1} + \frac{L2}{V2} + \frac{L_x}{V3}\right);$$

wherein, L1 is length of the first cable, L2 is length of the second cable, $L_x$ is length of the third cable, V1 is value of velocity factor of the first segment of the cable, V2 is value of velocity factor of the second segment of the cable, and V3 is value of velocity factor of the third segment of the cable.

As a preferred embodiment of the present invention, the process of calculating the number of measuring point M1 of one set of data in step (2), is:

calculating the number of measuring point M1 of one set of data according to following formula:

$$M1 = \frac{M \times L1}{(L1 + L2 + L_x)};$$

wherein, M is the number of selected measurement points, L1 is the length of the first segment of the cable, L2 is the length of the second segment of the cable, $L_x$ is the length of the third segment of the cable.

As a preferred embodiment of the present invention, calculating the number of measuring point M2 of one set of data in step (2), includes:

calculating the number of measuring point M2 of one set of data according to following formula:

$$M2 = \frac{M \times L2}{(L1 + L2 + L_x)};$$

wherein, M is the number of selected measurement points, L1 is the length of the first segment of the cable, L2 is the length of the second segment of the cable, $L_x$ is the length of the third segment of the cable.

As a preferred embodiment of the present invention, calculating the number of measuring point M3 of one set of data in step (2), includes:

calculating the number of measuring point M3 of one set of data according to following formula:

$$M3=M-M1-M2;$$

wherein, M is the number of selected measurement points.

As a preferred embodiment of the present invention, calculating the first set of measurement data of the first segment of the cable with using linear compensation in step (3.1), includes:

calculating the first set of measurement data of the first segment of the cable using linear compensation according to the following formula:

$$NData[N]=Data[N]+N \times Loss1 \times 2;$$

wherein, Loss1 is cable loss of the first segment of the cable, and the value of N is 0, 1, . . . , M1−1.

As a preferred embodiment of the present invention, calculating the second set of measurement data of the second segment of the cable with using linear compensation in step (3.2), includes:

calculating the second set of measurement data of the second segment of the cable using linear compensation according to following formula:

$$CLoss1=L1 \times Loss1 \times 2;$$

$$NData[N]=Data[N]+(N-M1) \times Loss2 \times 2+CLoss1;$$

wherein, L1 is the length of the first segment of the cable, Loss1 is the cable loss of the first segment of the cable, Loss2 is the cable loss of the second segment of the cable, CLoss1 is the fixed loss of the first segment of the cable, and the value of N is M1, . . . , (M1+M2−1).

As a preferred embodiment of the present invention, calculating the third set of measurement data of the third segment of the cable using linear compensation in step (3.3), includes: calculating the third set of measurement data of the third segment of the cable using linear compensation according to following formula:

CLoss2=L2×Loss2×2;

NData[N]=Data[N]+(N−M1−M2)×Loss3×2+CLoss1+CLoss2;

wherein, L2 is the length of the second segment of the cable, Loss2 is the cable loss of the second segment of the cable, Loss3 is the cable loss of the third segment of the cable, CLoss1 is the fixed loss of the first segment of the cable, CLoss2 is the fixed loss of the second segment of the cable, and the value of N is (M1+M2), . . . , (M−1).

As a preferred embodiment of the present invention, calculating DTF_SWR data RData[M] in step (4), includes:

calculating DTF_SWR data RData[M] according to following formula:

$$Rho = 10^{\frac{-NData[N]}{2}};$$

$$RData[N] = \begin{cases} 1000 (Rho = 1) \\ |1 + Rho| (Rho \neq 1) \end{cases};$$

wherein, Rho is reflection coefficient, NData[N] is compensation value of measurement data.

As a preferred embodiment of the present invention, calculating the fault point position DTF_Len in step (5.2), includes:

calculating the fault point position DTF_Len according to following formula:

$$DFT_{Len} = I \times \frac{(L1 + L2 + L_x)}{M - 1},$$

wherein, L1 is the length of the first segment of the cable, L2 is the length of the second segment of the cable, $L_x$ is the length of the third segment of the cable.

FIG. 1 is an overall flow chart of the method for accurate fault location in a multi-type cable connection system.

Where the method includes the following steps:

First, selecting the measurement format of the cable and antenna analyzer as DTF_Return_Loss, and setting the value of velocity factor of the cable to 1, the cable loss to 0, the value of measured distance to L, and selecting the number of measurement points as M, wherein L should be as stated in formula (1):

$$L \geq \left(\frac{L1}{V1} + \frac{L2}{V2} + \frac{Lx}{V3}\right)$$

Next, step 2 of the method includes exporting M measurement data Data[M] of the cable and antenna analyzer;

Next, step 3 of the method includes dividing the M measurement data into three sets of data, each set of data corresponding to one segment of the cable, and the points of three sets of data are M1 (formula (2)), M2 (formula (3)) and M3 (formula (4)):

$$M1 = \frac{M \times L1}{(L1 + L2 + Lx)} \quad (2)$$

$$M2 = \frac{M \times L2}{(L1 + L2 + Lx)} \quad (3)$$

$$M3 = M - M1 - M2 \quad (4)$$

Next, step 4 of the method includes processing the measurement data separately by using linear compensation;

Next, step 4 of the method additionally includes calculating the first set of measurement data of the first segment of the cable [[with]] using linear compensation, according to formula (5):

NData[N]=Data[N]+N×Loss1×2  (5)

wherein, the value of N is 0, 1, M1−1.

Next, step 4 of the method additionally includes calculating the second set of measurement data of the second segment of the cable using linear compensation, according to formula (6):

CLoss1=L1×Loss1×2

NData[N]=Data[N]+(N−M1)×Loss2×2+CLoss1  (6)

wherein the value of N is M1, . . . , (M1+M2−1), and CLoss1 is fixed loss of the first segment of the cable.

Next, step 4 of the method additionally includes calculating the third set of measurement data of the third segment of the cable using linear compensation, according to formula (7):

CLoss2=L2×Loss2×2

NData[N]=Data[N]+(N−M1−M2)×Loss3*2+CLoss1+CLoss2  (7)

wherein the value of N is (M1+M2), . . . , (M−1), and CLoss2 is fixed loss of the second segment of the cable.

Next, step 5 of the method includes calculating DTF_SWR data according to NData[M] data, and saved as RData[M] by using formula (8):

$$Rho = 10^{\frac{-NData[N]}{2}} \quad (8)$$

$$RData[N] = \begin{cases} 1000 (Rho = 1) \\ |1 + Rho| (Rho \neq 1) \end{cases}$$

Next, step 6 of the method includes calculating a location of the fault point.

Specifically, calculating the fault location in step 6 includes the following steps:

First, searching RData[N], and recording a maximum value in RData[N] as RMax, and recording its corresponding position in RData[N] as I;

Then, comparing RMax to a preset threshold SWR_Limit of DTF_SWR. If the value of RMax is bigger than the value of SWR_Limit, the cable system is in trouble, and the fault point position is recorded as DTF_Len, wherein DTF_Len should satisfy the formula (9):

$$DTF\_Len = I \times \frac{(L1 + L2 + Lx)}{M - 1} \quad (9)$$

If the value of RMax is smaller than the value of SWR_Limit, then the cable system runs normally.

Specifically, the lengths of the first cable segment and the second cable segment are accurate lengths, that is to say, L1 and L2 are determined lengths, and the length of the third cable segment Lx may be a determined length or an estimated length.

Wherein, the position corresponding to RMax in RData [N] is recorded as I as described above, which is calculated as 0 from the beginning.

In the specific experiment, the actual length of each cable is L1=92 m, L2=106 m, L3=200 m, and the actual total length is 398 m.

Figure 2:
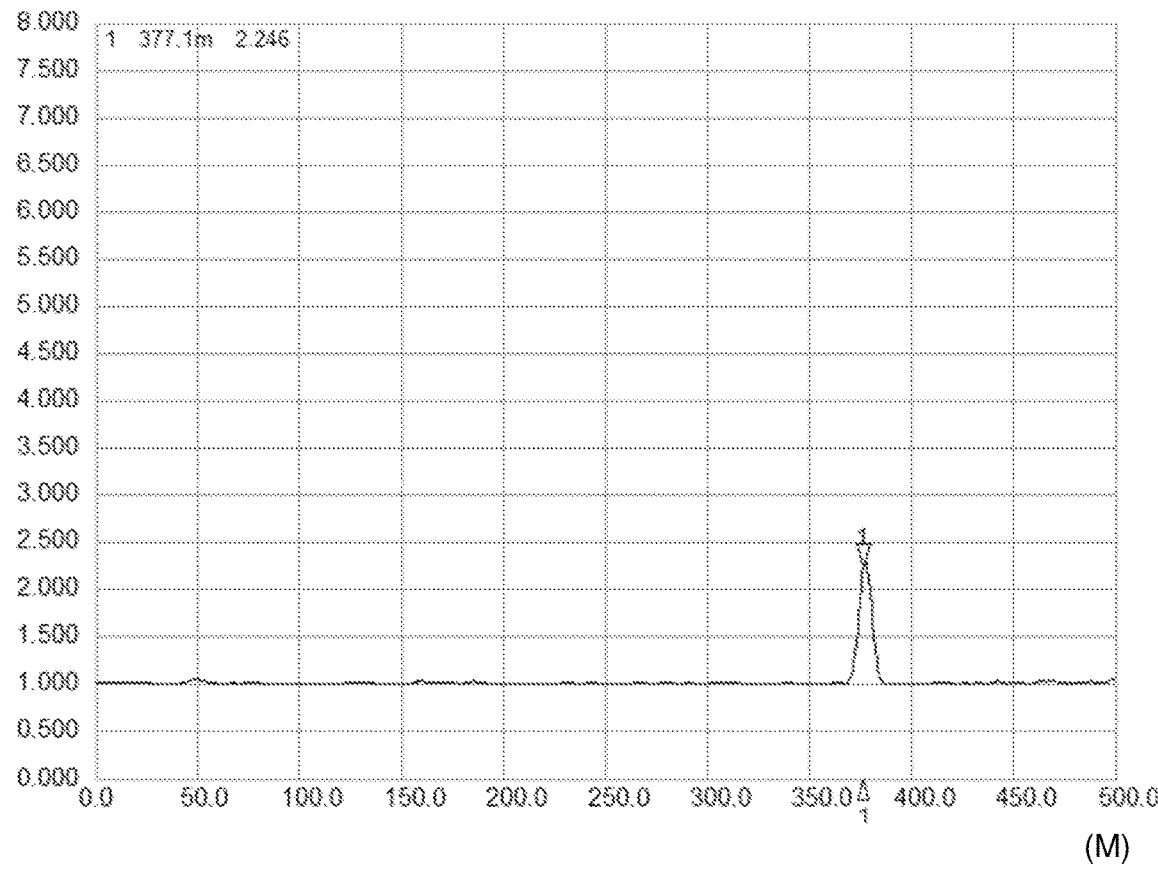
FIG. 2 is the measurement result diagram by using traditional measuring methods to measure cables.

FIG. 2 shows the results of measuring the cable system using the traditional test method. The total length of the three cables is 377.1 m with an error of 20.9 m.

Figure 3:
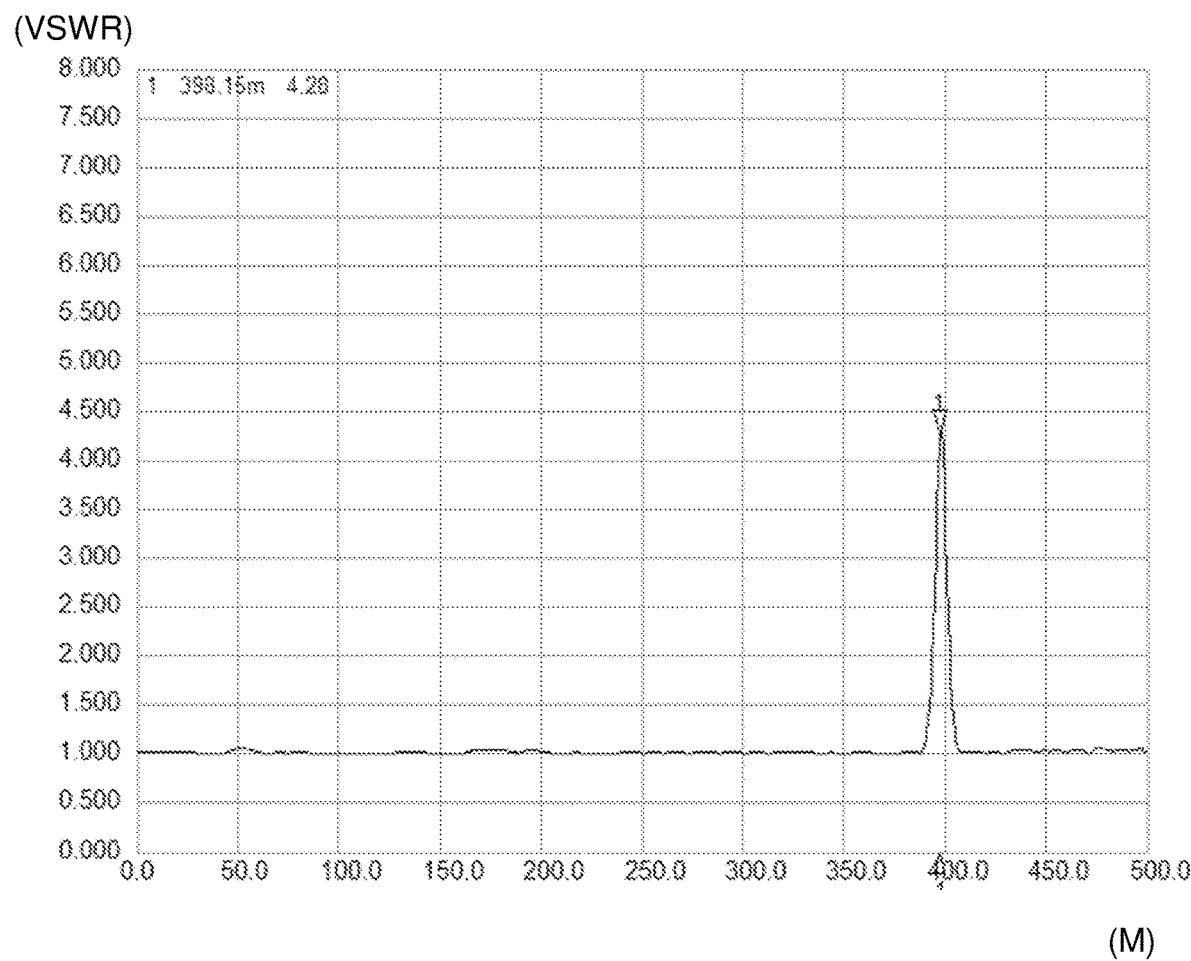
FIG. 3 is the cable measurement result diagram of the examples of the method for accurate fault location in a multi-type cable connection system in the present invention.

FIG. 3 shows the results of measuring the cable system by using the above method in the present invention, and the result is 398.15 m with an error of 0.15 m.

It can be seen from the comparison of the experimental results that the method of the present invention is indeed superior to the conventional positioning method, and is capable of accurately locating the fault location.

Meanwhile, the device for realizing accurate fault location in a multi-type cable connection system in the present invention, includes storage for storing programs and a processor for executing the programs, which implements the above method for accurate fault location in a multi-type cable connection system.

The computer readable storage medium, with a storing program, the program is executed by processor to implement the method for accurate fault location in a multi-type cable connection system.

By means of a blended data automatic analysis algorithm in the present invention, in the presence of multiple cables, data obtained through a one-time measurement can be accurately identified to determine which cable data of each scanning point belongs to, and after data allocation is completed, each group of data is separately corrected using cable parameters corresponding to the group of data, thereby obtaining an accurate fault position and a DTF return loss result. Through this new method of fault location, the accuracy of cable position measurement is greatly improved.

The above is only a preferred embodiment of the present invention, and is not intended to limit the present invention. Any modifications, equivalent substitutions and improvements made within the spirit and principles of the present invention should be included in the scope of protection of the present invention. Meanwhile, the present invention has been described with reference to the specific embodiments, and it is obvious that various modifications and changes can be made without departing from the spirit and scope of protection of the invention. Therefore, the instructions and drawings should be considered illustrative rather than restrictive.

What is claimed is:

1. A method for accurate fault location in a multi-type cable connection system, characterized in that, the method comprising:
   setting an initial data and measurement format of a cable and antenna analyzer, performing a one-time measurement of the multi-type cable using the cable and antenna analyzer, and exporting measurement data from the cable and antenna analyzer for a number of measurement points, M of the said cable and antenna analyzer;
   dividing the exported measurement data into three sets of the measurement data, each of the three sets of the measurement data corresponding to one segment of a cable of the multi-type cable connection system;
   calculating measuring points M1 for a first of the three sets of the measurement data:

$$M1 = \frac{M \times L1}{(L1 + L2 + L_x)};$$

wherein, M is the number of measurement points, L1 is a length of a first segment of a first cable, L2 is a length of a second segment of a second cable, and $L_x$ is a length of a third segment of a third cable,
   calculating M2 for a second of the three sets of the measurement data:

$$M2 = \frac{M \times L2}{(L1 + L2 + L_x)};$$

calculating M3 for a third of the three sets of measurement data: M3=M−M1−M2;
   processing the three sets of measurement data separately using linear compensation to generate compensated data;
   calculating a distance to fault return loss (DTF_SWR) that reflects a coefficient, Rho, calculating DTF_SWR data RData[M] based on the compensated data, where:

$$Rho = 10^{\frac{-NData[N]}{2}};$$

$$RData[N] = \begin{cases} 1000 (Rho = 1) \\ |1 + Rho|(Rho \neq 1) \end{cases};$$

NData[N] is a single compensation value of the measurement data; and
   calculating a location of a fault point to accurately find the fault location in the multi-type cable connection system based on the one-time measurement when a maximum value RMax in the single value RData[N] exceeds a preselected threshold.

2. The method for accurate fault location in a multi-type cable connection system according to claim 1, characterized in that, the measurement data includes a velocity factor of a cable, a cable loss, a value of a measured distance L, and a subset of the number of measurement points.

3. The method for accurate fault location in a multi-type cable connection system according to claim 2, characterized in that, the velocity factor of the multi-type cable is 1.

4. The method for accurate fault location in a multi-type cable connection system according to claim 2, characterized in that, the cable loss is 0.

5. The method for accurate fault location in a multi-type cable connection system according to claim 2, characterized in that, the value of the measured distance L accords with the following formula:

$$L \geq \left(\frac{L1}{V1} + \frac{L2}{V2} + \frac{L_x}{V3}\right);$$

wherein, L1 is the length of the first segment of the first cable, L2 is the length of the second segment of the second cable, $L_x$ is the length of the third segment of the third cable, V1 is a value of a velocity factor of the first segment of the first cable, V2 is a value of a velocity factor of the second segment of the second cable, and V3 is a value of a velocity factor of the third segment of the third cable.

6. The method for accurate fault location in a multi-type cable connection system according to claim 1, characterized in that, processing the three sets of measurement data separately using linear compensation further comprises:
calculating the first set of measurement data of the first segment of the first cable using linear compensation;
calculating the second set of measurement data of the second segment of the second cable using linear compensation;
calculating the third set of measurement data of the third segment of the third cable using linear compensation.

7. The method for accurate fault location in a multi-type cable connection system according to claim 1, characterized in that, calculating the location of the fault point further comprises:
searching RData[N], and recording a maximum value RMax in RData[N] and its corresponding position I in RData[N];
judging whether the maximum value RMax is greater than a preset threshold SWR_Limit of DTF_SWR or not; wherein when the maximum value RMax is greater than the preset threshold SWR_Limit of DTF_SWR then calculating and recording a fault point position DTF_Len; and wherein when the maximum value RMax is not greater than the preset threshold SWR_Limit of DTF_SWR the multi-type cable connection system runs normally.

8. The method for accurate fault location in a multi-type cable connection system according to claim 7, characterized in that, the fault point position DTF_Len is calculated according to:

$$DTF_{Len} = I \times \frac{(L1 + L2 + L_x)}{M - 1};$$

wherein, L1 is the length of the first segment of the first cable, L2 is the length of the second segment of the second cable, $L_x$ is the length of the third segment of the third cable.

9. A device for realizing accurate fault location in a multi-type cable connection system, comprising storage for storing a program and a processor for executing the program to implement the method for accurate fault location in a multi-type cable connection system of claim 1.

10. The device for realizing accurate fault location in a multi-type cable connection system according to claim 9, characterized in that, the initial data and measurement format includes a velocity factor of the multi-type cable, a cable loss, a measured distance L, and the number of measuring points M; the velocity factor of the multi-type cable is 1, the cable loss is 0, and the measured distance L accords with the following formula:

$$L \geq \left(\frac{L1}{V1} + \frac{L2}{V2} + \frac{L_x}{V3}\right);$$

wherein, L1 is the length of the first segment of the first cable, L2 is the length of the second segment of the second cable, $L_x$ is the length of the third segment of the third cable, V1 is a value of a velocity factor of the first segment of the first cable, V2 is a value of a velocity factor of the second segment of the second cable, and V3 is a value of a velocity factor of the third segment of the third cable.

11. The device for realizing accurate fault location in a multi-type cable connection system according to claim 9, characterized in that, calculating the location of the fault point further comprises:
searching RData[N], and recording a maximum value RMax in RData[N] and its corresponding position I in RData[N];
judging whether the maximum value RMax is greater than a preset threshold SWR_Limit of DTF_SWR or not; wherein when the maximum value RMax is greater than the preset threshold SWR_Limit of DTF_SWR then calculating and recording a fault point position DTF_Len; and wherein when the maximum value RMax is not greater than the preset threshold SWR_Limit of DTF_SWR the multi-type cable connection system runs normally; wherein the fault point position DTF_Len is calculated according to:

$$DTF_{Len} = I \times \frac{(L1 + L2 + L_x)}{M - 1};$$

wherein, L1 is the length of the first segment of the first cable, L2 is the length of the second segment of the second cable, and $L_x$ is the length of the third segment of the third cable.

12. A non-transitory computer readable storage medium, comprising a storing program executed by a processor to implement the method for accurate fault location in a multi-type cable connection system of claim 1.

* * * * *